(12) United States Patent
Kaysser

(10) Patent No.: US 10,144,286 B2
(45) Date of Patent: Dec. 4, 2018

(54) OPERATING UNIT HAVING A CAPACITIVE TOUCH PANEL

(71) Applicant: Continental Automotive GmbH, Hannover (DE)

(72) Inventor: Sascha Kaysser, Maintal (DE)

(73) Assignee: Continental Automotive GmbH, Hannover (DE)

( * ) Notice: Subject to any disclaimer, the term of this patent is extended or adjusted under 35 U.S.C. 154(b) by 54 days.

(21) Appl. No.: 15/035,683

(22) PCT Filed: Nov. 10, 2014

(86) PCT No.: PCT/EP2014/074180
§ 371 (c)(1),
(2) Date: May 10, 2016

(87) PCT Pub. No.: WO2015/067803
PCT Pub. Date: May 14, 2015

(65) Prior Publication Data
US 2016/0303971 A1   Oct. 20, 2016

(30) Foreign Application Priority Data

Nov. 11, 2013 (DE) .................. 10 2013 222 940

(51) Int. Cl.
| | | |
|---|---|---|
| *G06F 3/045* | (2006.01) |
| *B60K 35/00* | (2006.01) |
| *B60K 37/06* | (2006.01) |
| *G06F 3/041* | (2006.01) |
| *G06F 3/044* | (2006.01) |
| *H03K 17/955* | (2006.01) |
| *H03K 17/96* | (2006.01) |

(52) U.S. Cl.
CPC .............. *B60K 35/00* (2013.01); *B60K 37/06* (2013.01); *G06F 3/044* (2013.01); *G06F 3/0416* (2013.01); *H03K 17/955* (2013.01); *H03K 17/962* (2013.01); *B60K 2350/1012* (2013.01); *G06F 2203/04108* (2013.01)

(58) Field of Classification Search
CPC ........ G06F 3/0416; G06F 3/041; G06F 3/044; G06F 2203/04108; B60K 37/06; B60K 2350/1012; B60K 35/00
See application file for complete search history.

(56) References Cited

U.S. PATENT DOCUMENTS 8,078,359 B2 * 12/2011 Small .................. B60K 35/00
                                                                701/1
8,390,592 B2    3/2013 Grundmann et al.
(Continued)

FOREIGN PATENT DOCUMENTS

| EP | 2305508 | 4/2011 |
| WO | WO 2009147062 | 12/2009 |
| WO | WO 2013 053529 | 4/2013 |

*Primary Examiner* — Vijay Shankar
(74) *Attorney, Agent, or Firm* — Cozen O'Connor

(57) ABSTRACT

An operating element in a vehicle includes a capacitive touch panel and a capacitive sensor unit configured to detect a user approaching the touch panel. When the capacitive sensor unit detects the approaching user, a first control unit activates the touch panel, such that the touch panel may be activated from a sleep mode by a single movement, and such that the user can, at the same time, perform inputs using the touch panel.

7 Claims, 2 Drawing Sheets

(56) References Cited

U.S. PATENT DOCUMENTS

| | | | |
|---|---|---|---|
| 8,892,299 B2* | 11/2014 | Small | B60K 35/00 701/1 |
| 9,354,698 B2* | 5/2016 | Alameh | G06F 3/01 |
| 9,537,995 B2* | 1/2017 | Salo | H04M 1/0283 |
| 9,874,949 B2* | 1/2018 | Stern | G06F 3/0383 |
| 2011/0082615 A1* | 4/2011 | Small | B60K 35/00 701/36 |
| 2011/0082616 A1* | 4/2011 | Small | B60K 35/00 701/31.4 |
| 2013/0162584 A1 | 6/2013 | Persson | |
| 2013/0278547 A1 | 10/2013 | Wu et al. | |
| 2014/0176447 A1* | 6/2014 | Alameh | G06F 3/044 345/173 |

* cited by examiner

OPERATING UNIT HAVING A CAPACITIVE TOUCH PANEL

CROSS-REFERENCE TO RELATED APPLICATIONS

This is a U.S. national stage of application No. PCT/EP2014/074180, filed on 10 Nov. 2014, which claims priority to the German Application No. 10 2013 222 940.2 filed 11 Nov. 2013, the content of both incorporated herein by reference.

BACKGROUND OF THE INVENTION

1. Field of the Invention

The invention relates to an operating unit of a vehicle, a vehicle and a method.

2. Related Art

In the automotive industry, operating units comprising a capacitive touch panel can be used for diverse user input applications in vehicles. Firstly, predefined requirements may apply to the quiescent current consumption of such operating elements. Secondly, it may be necessary for such operating elements to be able to react rapidly to a user input. For a rapid reaction to the user input or to a touch if appropriate with a classification of the user input regarding validity or invalidity, and for the evaluation of the user input, evaluation electronics should usually be in an active operating state. In this case, the evaluation electronics can comprise a sensor array and a microcontroller for controlling the sensor array. If appropriate, a main microcontroller may also be active to be able to directly evaluate further user inputs. An increased current consumption can ensue from these active components.

WO 2009/147062 describes a detection system for approach recognition, wherein far-range detection is effected by an optical or acoustic sensor.

SUMMARY OF THE INVENTION

It is an object of the invention to reduce the current consumption of operating elements of vehicles.

To achieve this object, a first aspect of the invention relates to an operating unit of a vehicle, the operating unit comprising a capacitive touch panel for receiving a user input, a capacitive sensor unit and a first control unit. In this case, the capacitive sensor unit is configured to detect an approach of a user to the capacitive touch panel. Furthermore, the capacitive touch panel is configured to detect a touch of the capacitive touch panel by the user or the approach of the user to the capacitive touch panel. The first control unit is furthermore configured to activate the capacitive touch panel if the capacitive sensor unit detects the approach of the user to the capacitive touch panel.

The operating unit can thus be woken from a power saving quiescent state without an additional user input. Consequently, if no user input is effected, the operating unit can have a low quiescent current. If the user input is then effected, the touch panel of the operating unit can be automatically woken by the capacitive sensor unit detecting the approach of the user and instigating an activation of the touch panel. Consequently, the advantages of a low quiescent current consumption and user-friendliness can accrue from the operating unit since no further user input is necessary for activating the touch panel. In other words, the capacitive touch panel can be woken from a quiescent state or standby mode by the capacitive sensor unit. For this purpose, the capacitive sensor unit can detect the approach of a user and, after detection of the approach, wake the capacitive touch panel from the standby mode. In this case, the approach of the user can simultaneously also be an operating gesture of the user for user input. That is, the user, with the approach that leads to the operating gesture on the touch panel, activates the touch panel. In this way, there is no need for a separate input or a separate button press by the user for activating the touch panel. In other words, with a single movement sequence the user can simultaneously activate the touch panel and perform the user input on the now activated touch panel. The touch panel can thus be activated with a single-stage movement without an additional input. What can therefore be made possible is that the user does not experience any disadvantages as a result of the quiescent state in this way.

In this case, the capacitive touch panel can be understood to be a two-dimensional touch panel that capacitively detects a touch of the capacitive touch panel or an approach to the capacitive touch panel. Further, the capacitive touch panel can be configured to detect a position of the touch or of the approach. By way of example, the touch panel can be a touchpad or a touch screen. Further, the touch panel can be configured to recognize multi-finger gestures. In this case, the user input that can be received by the touch panel can be understood to be a touch of the touch panel by the user and/or an approach of the user to the touch panel. By way of example, for user input the user can touch the touch panel with one finger, with a plurality of fingers, with a stylus, or with other objects, or approach the touch panel with the objects mentioned, which can be recognized by the touch panel.

The capacitive sensor unit can be understood to be a sensor unit configured to measure a capacitance. The capacitive sensor unit can furthermore be configured to transmit signals that can be received by a signal input of the first control unit. By way of example, the capacitive sensor unit can be configured to continuously or regularly transmit a signal comprising a capacitance. The control unit can monitor the capacitance measured by the capacitive sensor unit. Furthermore, the first control unit can be configured as a microcontroller. In the case where an object approaches the capacitive sensor unit, the measured capacitance can change. In this way, the approach of the user can be detected or recognized by the first control unit or by the capacitive sensor unit. Furthermore, the first control unit can be configured to transmit a break-up signal to the capacitive touch panel upon detection of the approach of the user.

By way of example, the capacitive sensor unit can be configured to detect the approach of the user in a far region of the touch panel. The touch panel can be configured to detect a touch or an approach in a near region of the touch panel. In this case, the term "approach" or "proximity" can be understood to mean that the user penetrates into the far region of the touch panel. In this case, the distance between the far region and the touch panel can be dimensioned such that the control of the operating unit after the detection of the approach of the user to the touch panel has enough time to activate the touch panel. By way of example, the distance can be dimensioned such that, at a typical movement speed, the control has a time of at least 100 ms to activate the touch panel. The far region of the touch panel is, for example, at a distance of 10 cm to 30 cm from the touch panel.

Since the capacitive sensor unit can detect the approach of the user by a capacitance measurement, the approach can be detected accurately. In this case "accurately" can be understood to mean that the position and/or the direction of the approach can be determined accurately and only an approach directed in the direction of the touch panel is detected. Furthermore, the approach of the user to the touch panel can also be differentiated from a different movement of the user, since the capacitive sensor unit in this case detects only approaches to the touch panel and not other movements of the user.

In accordance with one exemplary embodiment of the invention, the operating unit is configured to deactivate the capacitive touch panel in a quiescent state of the operating unit. Furthermore, the operating unit is configured to keep the capacitive sensor unit and the first control unit activated.

In this case, a quiescent state can be understood to be a sleep mode or a standby mode of the touch panel. In this case, in the quiescent state a sensor array and/or a control unit of the touch panel can be deactivated. In this way, the operating unit can have a low current consumption in the quiescent state, i.e., the operating unit can have a low quiescent current. The capacitive sensor unit and the first control unit can continue to be activated in the quiescent state. In other words, in the quiescent state, the capacitive sensor unit can still detect the approach of the user to the touch panel and the first control unit can wake the touch panel from the quiescent state if the capacitive sensor unit detects the approach. That is to say that the units required for detecting the approach and for activating the touch panel can be activated in the quiescent state.

In accordance with a further exemplary embodiment of the invention, the operating unit comprises a second control unit for controlling the capacitive touch panel. Furthermore, the first control unit is configured to transmit an activation signal to the second control unit for activating the capacitive touch panel. The second control unit is configured to activate the capacitive touch panel after receiving the activation signal.

By way of example, the first control unit can be a microcontroller for monitoring the capacitive sensor. The second control unit can be a microcontroller of the touch panel. If the user approaches the touch panel, the first control unit can detect that the capacitance measured by the capacitive sensor unit changes. In this case, the first control unit can transmit the activation signal to the second control unit. Since the second control unit of the touch panel receives the activation signal, further components can be activated together with the touch panel. By way of example, an illumination of the touch panel can be activated if the user approaches the touch panel.

In accordance with a further exemplary embodiment of the invention, the operating unit comprises a main control unit for controlling the operating unit. In this case, the first control unit is configured to transmit a first activation signal to the main control unit for activating the touch panel. Furthermore, the main control unit is configured to transmit a second activation signal to a second control unit after receiving the first activation signal, and the second control unit is configured to activate the touch panel after receiving the second activation signal.

In this way, the second control unit can also be put into a quiescent state and can be activated again from the quiescent state. The quiescent current of the operating unit can be reduced further as a result.

In accordance with a further exemplary embodiment of the invention, the first control unit and the capacitive sensor unit are operated jointly with a quiescent current that is less than or equal to 100 µA. The capacitive touch panel has a current consumption that is greater than or equal to 1 mA.

In this way, the operating unit can satisfy requirements with regard to the quiescent current consumption of operating units in vehicles. If the touch panel is active, it can be operated with enough electric current, such that a user input can be accurately recognized.

In accordance with a further exemplary embodiment of the invention, the capacitive sensor unit is configured as a conductor loop.

In this case, the conductor loop can be configured to measure a capacitance of the conductor loop with respect to ground. Furthermore the capacitive sensor unit configured as a conductor loop can be arranged around the capacitive touch panel. Moreover, the conductor loop can also be arranged alongside the touch panel. The capacitive sensor unit can be arranged flexibly in this way. As a result, the region in which the approach is intended to be detected by the conductor loop can be configured accurately. The first control unit can be configured to monitor a capacitance measured by the conductor loop and to transmit an activation signal to the capacitive touch panel if the capacitance measured by the capacitive sensor unit exceeds a predetermined value.

In accordance with a further exemplary embodiment of the invention, the capacitive touch panel is arranged within the conductor loop.

In other words, the conductor loop of the capacitive sensor unit can be arranged outside a boundary of the capacitive touch panel. In this way, the approach can be detected for the entire touch panel.

In accordance with a further exemplary embodiment of the invention, the capacitive sensor unit comprises a plurality of capacitive proximity sensors.

By way of example, a capacitive sensor unit configured as a conductor loop can be arranged around the touch panel and one or a plurality of capacitive sensor units can be arranged alongside the touch panel. Furthermore, a plurality of capacitive sensor units can also cover the touch panel. In this way, the region in which the approach of the user is intended to be detected can be configured accurately.

A further aspect of the invention relates to a display and operating unit comprising an operating unit described above and below. In this case, the capacitive touch panel is configured as a touch screen for displaying information and for receiving the user input.

The capacitive touch panel can thus be configured as a touch screen for representing information or as a touch screen. By way of example, the operating unit can be an operating unit of a vehicle audio system. At the same time, in this example, information concerning the audio system can be represented and a user input can be performed on the operating unit by touch or approach. In the quiescent state of the operating unit, the sensor array of the touch screen can be deactivated, whereas information is still represented on the touch screen. Alternatively, the image reproduction of the touch screen can be deactivated in the quiescent state. In this way, information can be represented and user inputs can be effected on the operating element.

A further aspect of the invention relates to a vehicle comprising an operating unit described above and below.

The operating unit of the vehicle can have a low quiescent current. In this way, the operating unit can still react to a user input, even if the engine of the vehicle is not running. Furthermore, the vehicle can be an electric automobile. In this case, the rechargeable battery charge of the electric automobile can last longer since the operating unit has a low quiescent current consumption. The range of the electric automobile can thus be increased as well.

A further aspect of the invention relates to a method for operating an operating device comprising a capacitive touch panel in a vehicle. One step of the method is detecting an approach of a user to the capacitive touch panel by a capacitive sensor unit of the operating device. A further step of the method involves activating the capacitive touch panel by a first control unit if the capacitive sensor unit detects the approach of the user to the capacitive touch panel. Furthermore, the method involves receiving a user input by detecting a touch of the capacitive touch panel by the user or by detecting the approach of the user to the capacitive touch panel by the capacitive touch panel.

In this case, the steps of the method can be performed in the stated order. Alternatively, the steps can also be performed in a different order or in parallel. In this case, the features and advantages described in association with the operating unit also apply to the method.

The embodiments described relate equally to an operating unit, a vehicle and method, even though individual embodiments are described exclusively with respect to the operating unit, with respect to the vehicle or with respect to the method.

Synergistic effects can arise from different combinations of the embodiments, even if these are not described below.

BRIEF DESCRIPTION OF THE DRAWINGS

Further features, advantages and possibilities for application of the invention are evident from the following description of the exemplary embodiments and figures. In this case, all described and/or pictorially illustrated features by themselves and in arbitrary combination form the subject matter of the invention also independently of their compilation in the individual claims or the dependency references thereof. In the drawings:

DETAILED DESCRIPTION OF THE PRESENTLY PREFERRED EMBODIMENTS

The figures are illustrated schematically and not as true to scale.

Figure 1:
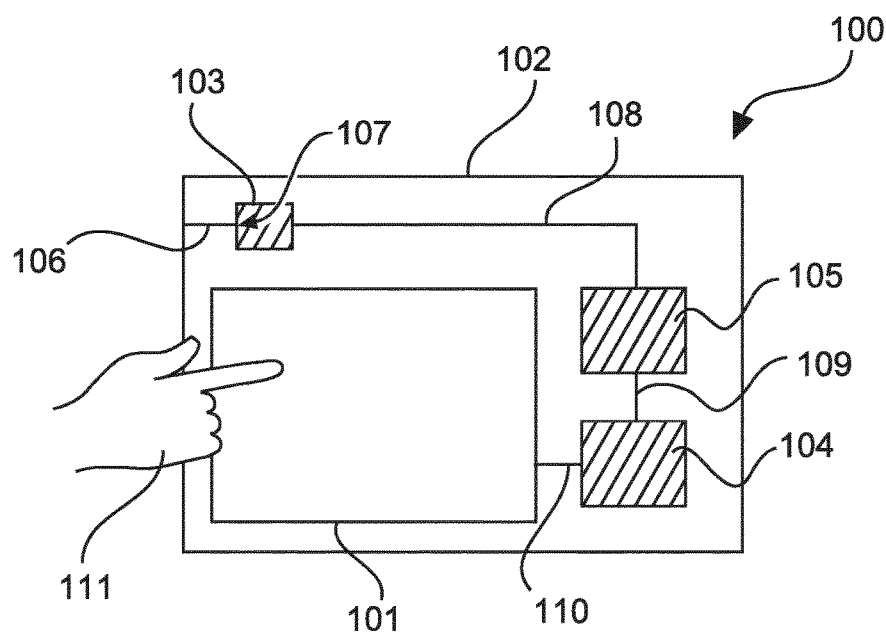
FIG. 1 shows an operating unit in accordance with one exemplary embodiment of the invention.

An exemplary embodiment of the invention as illustrated with reference to FIG. 1 relates to an operating unit 100 of a vehicle 300 comprising a capacitive touch panel 101 for receiving a user input 111, a capacitive sensor unit 102 and a first control unit 103. In this case, the capacitive sensor unit 102 is configured to detect an approach of a user to the capacitive touch panel 101. The capacitive touch panel 101 is furthermore configured to detect a touch 111 of the capacitive touch panel 101 by the user or the approach of the user to the capacitive touch panel 101. The first control unit 103 is configured to activate the capacitive touch panel 101 if the capacitive sensor unit 102 detects the approach of the user to the capacitive touch panel.

In accordance with a further exemplary embodiment of the invention as illustrated with reference to FIG. 1, the operating unit 100 furthermore comprises a second control unit 104 for the touch panel 101 and a main control unit 105 for the operating unit 100. In this case, the first control unit 103 has an input 107 for the capacitive sensor unit 102. In this exemplary embodiment, the capacitive sensor unit 102 is embodied as a conductor loop arranged around the touch panel 101, that is to say that the touch panel 101 is arranged within the conductor loop 102. The capacitive sensor unit is connected to the first control unit 103 by the connection 106, e.g., a conductor and/or a radio connection. The first control unit 103 is connected to the main control unit 105 by the connection 108, and the main control unit 105 is connected to the second control unit 104 of the touch panel 101 by the connection 109. The second control unit 104 can have a plurality of inputs for a sensor array of the capacitive touch panel 101, which are not illustrated in the figure. The connection 110 between the touch panel 101 and the second control unit 104 can likewise comprise a plurality of connections between the sensor array of the touch panel 101 and the second control unit 104. In this case, the connections mentioned in the embodiments described are embodied for signal transport. By way of example, they are conductor and/or radio connections.

If, for example, the user's hand 111 approaches the touch panel 101, the capacitive sensor unit 102 measures a change in the capacitance. This change in the capacitance is registered by the first control unit 103. In this case, the first control unit 103 transmits a first wake-up signal to the main control unit 105 via the connection 108. The main control unit 105 in turn forwards a second wake-up signal to the second control unit 104 of the touch panel 101 via the connection 109. The control unit 104 then transmits a third wake-up signal to the touch panel 101, whereupon the touch panel 101 becomes active and can receive a user input. The main control unit 105 can instigate further steps that are intended to be performed when the touch panel 101 is activated.

In the quiescent state or for the quiescent state of the touch panel, the main control unit 105 is configured to transmit a standby signal to the second control unit 104. The second control unit 104 thereupon deactivates the touch panel 101 or puts the touch panel 101 into the quiescent mode. This can be effected for example automatically after a certain time in which no activity or user input has taken place. If appropriate, the second control unit 104 can likewise be deactivated in the quiescent mode or be put into the quiescent mode.

Figure 2:
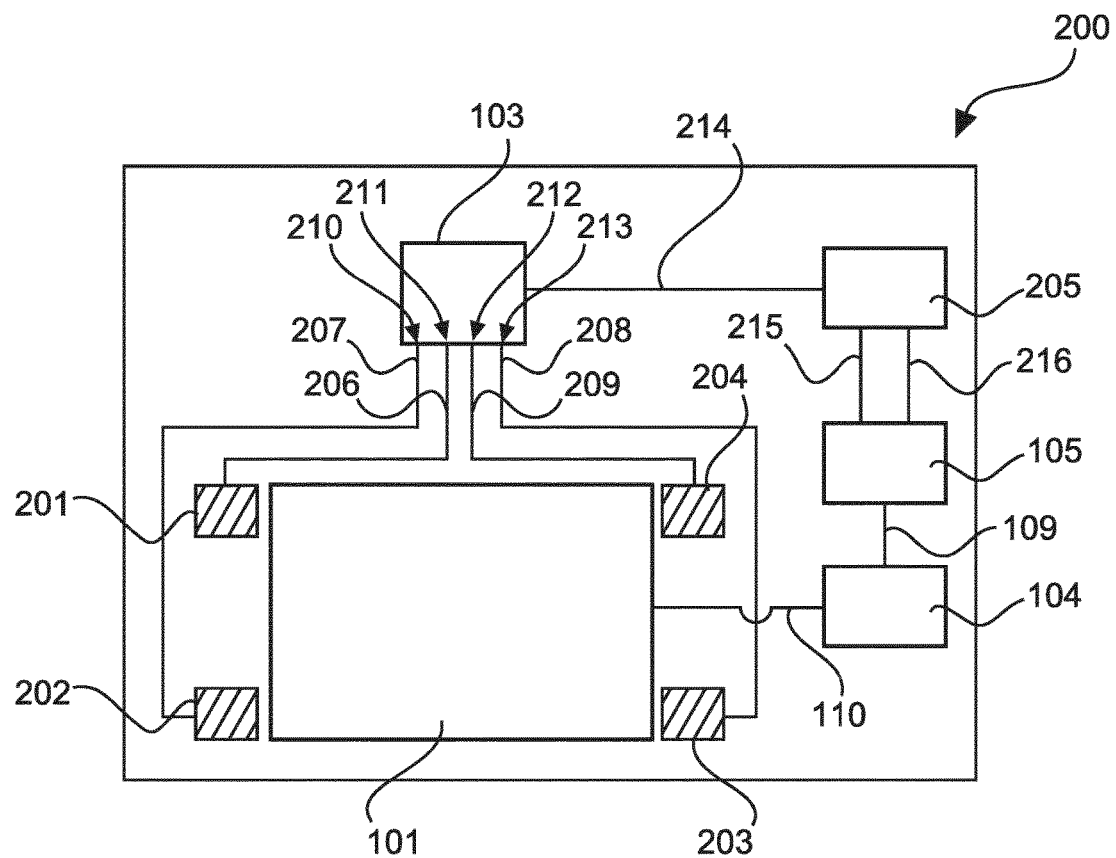
FIG. 2 shows an operating unit in accordance with one exemplary embodiment of the invention.

An operating unit in accordance with a further exemplary embodiment of the invention is illustrated with reference to FIG. 2. In accordance with this exemplary embodiment, the operating unit 200 comprises a plurality of capacitive sensor units 201, 202, 203 and 204. In accordance with a further exemplary embodiment of the invention described with reference to FIG. 2, the capacitive sensor units 201, 202, 203 and 204 are arranged outside the touch panel 101 each arranged, respectively, in the vicinity of a corner of the touch panel 101. That is to say that other arrangements are also possible in other exemplary embodiments. The capacitive sensor units 201, 202, 203 and 204 are, in each case, connected to the first control unit 103. For this purpose, the first control unit 103 has four inputs 210, 211, 212 and 213, which are connected to the capacitive sensor units via connections 206, 207, 208 and 209. The first control unit 103 is connected to a central control unit 205 by a connection 214. The central control unit 205 in this exemplary embodiment is embodied as a so-called system basis chip, which provides the voltage supply and reset monitoring for the main control unit 105, for the second control unit 104 of the touch panel 101 and for the touch panel 101. For this purpose, the central control unit 205 is connected to the main control unit 105 via a first connection 215 for voltage supply. Furthermore, the central control unit 205 is connected to the main control unit 105 for reset monitoring by a second connection 216, and the main control unit 105 is connected to the second control unit 104 of the touch panel 101 by the connection 109. The second control unit 104 can have a plurality of inputs for a sensor array of the capacitive touch panel 101, which are not illustrated in the figure. The connection 110 between the touch panel 101 and the second control unit can likewise comprise a plurality of connections between the sensor array of the touch panel 101 and the second control unit.

If the user approaches the touch panel 101 for user input, then, for example, one or a plurality of the capacitive sensor units 201, 202, 203 and 204 measure a change in the capacitance. In this case, the first control unit 103 registers the change in the capacitance of the respective sensor unit 201, 202, 203 and/or 204 and transmits a first wake-up signal to the central control unit 205. In this case, the central control unit 205 supplies the main control unit 105 with the supply voltage and transmits a second wake-up signal to the main control unit 105 of the operating unit. The operating unit 200 transmits a third wake-up signal to the second control unit 104 of the touch panel 101, whereupon the second control unit 104 activates the touch panel 101. In order to put the touch panel 101 into the quiescent state, the main control unit 105 transmits a standby signal to the second control unit 104 of the touch panel 101, whereupon the second control unit 104 deactivates the touch panel 101 or puts it into the quiescent state. Afterward, the main control unit 105 deactivates the supply voltage provided by the central control unit 205, such that the second control unit 104 and the touch panel 101 no longer consume current.

Figure 3:
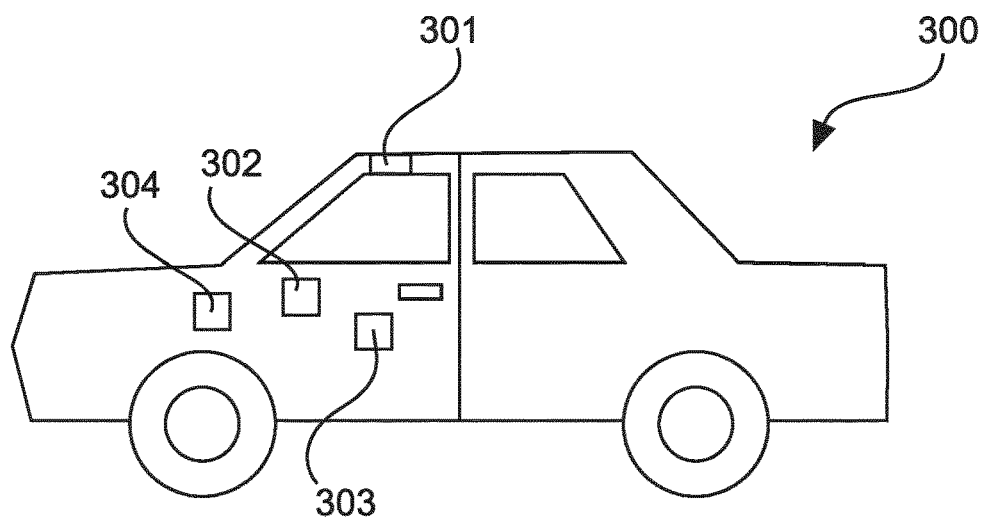
FIG. 3 shows a vehicle in accordance with one exemplary embodiment of the invention.

FIG. 3 illustrates a vehicle 300 comprising an operating unit in accordance with a further exemplary embodiment of the invention. The vehicle comprises a roof operating unit 301, a radio, air-conditioning and navigation operating unit 302 and a window regulator operating unit 303, which are configured in accordance with the operating units mentioned in the embodiments and exemplary embodiments described in the present application. In this case, the operating units 301, 302 and 303 are controlled by a central control unit 304. Alternatively, the operating units 301, 302 and 303 can each have dedicated control units that are not controlled centrally via the central control unit 304, even though this is not explicitly illustrated in this exemplary embodiment. Furthermore, each of the operating units 301, 302 and 303 can recognize an approach of a user and derive function-specific activities therefrom by the mechanisms described in the context of the present invention.

Figure 4:
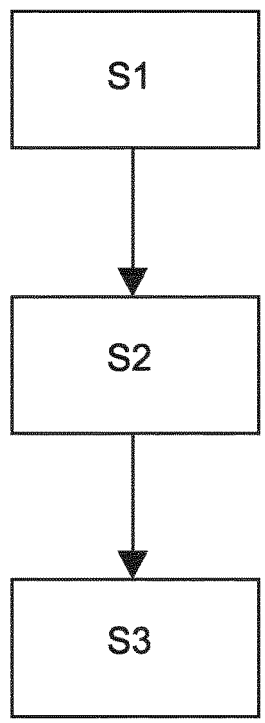
FIG. 4 shows a flow diagram of a method in accordance with one exemplary embodiment of the invention.

FIG. 4 shows a flow diagram of a method for operating an operating device comprising a capacitive touch panel in a vehicle in accordance with one exemplary embodiment of the invention. The method comprises the step S1 of detecting an approach of a user to the capacitive touch panel by a capacitive sensor unit of the operating device. Furthermore, the method involves performing step S2 of activating the capacitive touch panel by a first control unit if the capacitive sensor unit detects the approach of the user to the capacitive touch panel. The method furthermore comprises the step S3 of receiving a user input by detecting a touch of the capacitive touch panel by the user or by detecting the approach of the user to the capacitive touch panel by the capacitive touch panel.

It should supplementarily be pointed out that "comprising" or "having" does not preclude other elements and "a(an)" or "one" does not preclude a plurality. Furthermore, it should be pointed out that features that have been described with reference to one of the above exemplary embodiments or embodiments can also be used in combination with other features of other exemplary embodiments or embodiments described above. Reference signs in the claims should not be regarded as restrictions.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An operating unit (100) of a vehicle (300), the operating unit (100) comprising:
 a capacitive touch panel (101) configured to receive a user input;
 a first capacitive sensor unit (102), the first capacitive sensor unit (102) being configured as a conductor loop;
 a second capacitive sensor unit comprising a plurality of capacitive sensors arranged around the capacitive touch panel;
 a third capacitive sensor unit comprising a second plurality of capacitive sensors arranged so as to cover the touch panel; and
 a first control unit (103),
 wherein:
  the first, second and third capacitive sensor units cooperate to detect an approach of a user to the capacitive touch panel (101),
  the capacitive touch panel (101) is configured to detect a touch of the capacitive touch panel (101) by the user or the approach of the user to the capacitive touch panel (101),
  the first control unit (103) is configured to activate the capacitive touch panel (101) if one or more of the first, second and third capacitive sensor units detect the approach of the user to the capacitive touch panel (101), and
  the conductor loop being arranged so as to surround the capacitive touch panel (101) such that the capacitive touch panel (101) is arranged entirely within the conductor loop.

2. The operating unit (100) as claimed in claim 1, wherein:
 the operating unit (100) is configured to deactivate the capacitive touch panel (101) in a quiescent state of the operating unit (100), and
 the operating unit (100) is configured to keep the first, second and third capacitive sensor units and the first control unit (103) activated.

3. The operating unit (100) as claimed in claim 1, wherein:

the operating unit (100) comprises a second control unit (104) configured to control the capacitive touch panel (101), the first control unit (103) is configured to transmit an activation signal to the second control unit (104) for activating the capacitive touch panel (101), and the second control unit is configured to activate the capacitive touch panel (101) after receiving the activation signal.

4. The operating unit (100) as claimed in claim 1, wherein:

the first control unit (103) and the first capacitive sensor unit (102) are operated jointly with a quiescent current that is less than or equal to 100 µA, and the capacitive touch panel (101) has a current consumption that is greater than or equal to 1 mA.

5. A system comprising:

a display; and the operating unit (100) as claimed in claim 1, wherein the capacitive touch panel (101) is configured as a touch screen for displaying information and for receiving the user input.

6. A vehicle (300) comprising the operating unit (100) as claimed in claim 1.

7. A method for operating an operating device having a capacitive touch panel and first, second and third capacitive sensor units in a vehicle, the method comprising:

detecting, by one or more of the first, second and third capacitive sensor units of the operating device, an approach of a user to the capacitive touch panel (S1), the first capacitive sensor unit being configured as a conductor loop arranged so as to surround the capacitive touch panel such that the capacitive touch panel is arranged entirely within the conductor loop, the second capacitive sensor unit comprising a plurality of capacitive sensors arranged around the capacitive touch panel, and the third capacitive sensor unit comprising a second plurality of capacitive sensors arranged so as to cover the touch panel;

activating, by a first control unit, the capacitive touch panel if one or more of the first, second and third capacitive sensor units detect the approach of the user to the capacitive touch panel (S2); and receiving, by the capacitive touch panel, a user input by detecting a touch of the capacitive touch panel by the user or by detecting the approach of the user to the capacitive touch panel (S3).

* * * * *